United States Patent
Wei et al.

(10) Patent No.: US 10,014,326 B2
(45) Date of Patent: Jul. 3, 2018

(54) METHOD FOR FABRICATING ARRAY SUBSTRATE, ARRAY SUBSTRATE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Xiaodan Wei, Beijing (CN); Xingqiang Zhang, Beijing (CN); Zhong Lu, Beijing (CN); Dongkoog Jang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

(*) Notice: Subject to any disclaimer, the term of this patent is extended or adjusted under 35 U.S.C. 154(b) by 728 days.

(21) Appl. No.: 14/352,581

(22) PCT Filed: Mar. 25, 2013

(86) PCT No.: PCT/CN2013/073143
§ 371 (c)(1),
(2) Date: Apr. 17, 2014

(87) PCT Pub. No.: WO2014/127552
PCT Pub. Date: Aug. 28, 2014

(65) Prior Publication Data
US 2016/0079278 A1    Mar. 17, 2016

(30) Foreign Application Priority Data
Feb. 19, 2013 (CN) .......................... 2013 1 0053700

(51) Int. Cl.
*H01L 29/04* (2006.01)
*H01L 29/10* (2006.01)
(Continued)

(52) U.S. Cl.
CPC ........ *H01L 27/124* (2013.01); *H01L 27/1218* (2013.01); *H01L 27/1248* (2013.01);
(Continued)

(58) Field of Classification Search
CPC ........... G02F 1/13394; G02F 1/136227; H01L 27/1248; H01L 27/1214; H01L 27/124
See application file for complete search history.

(56) References Cited

U.S. PATENT DOCUMENTS 8,471,973 B2 * 6/2013 Lin .................. G02F 1/136209
349/43
8,896,792 B2 * 11/2014 Lee .................. G02F 1/133707
349/136
(Continued)

FOREIGN PATENT DOCUMENTS

CN    1530701 A    9/2004
CN    1844992 A    10/2006
CN    102881654 A    1/2013

OTHER PUBLICATIONS

Internatonal Search Report dated Nov. 21, 2013; PCT/CN2013/073143.
(Continued)

*Primary Examiner* — Joseph C Nicely
*Assistant Examiner* — David Goodwin
(74) *Attorney, Agent, or Firm* — Ladas & Parry LLP; Loren K. Thompson

(57) ABSTRACT

A method for fabricating an array substrate, an array substrate and a display device are provided. The method for fabricating the array substrate includes: forming a spacer
(Continued)

layer on the array substrate, the spacer layer is disposed under a planarized layer and corresponds to a location of a via hole in the planarized layer, wherein the planarized layer is formed of a hot melt material.

5 Claims, 2 Drawing Sheets

(51) Int. Cl.
*H01L 21/84* (2006.01)
*H01L 27/12* (2006.01)
*H01L 29/66* (2006.01)
*H01L 29/786* (2006.01)

(52) U.S. Cl.
CPC .... *H01L 27/1259* (2013.01); *H01L 29/66765* (2013.01); *H01L 29/78678* (2013.01)

(56) References Cited

U.S. PATENT DOCUMENTS

| | | | |
|---|---|---|---|
| 9,799,683 B2* | 10/2017 | Hou | H01L 27/1248 |
| 9,871,061 B2* | 1/2018 | Choi | H01L 27/124 |
| 2002/0085167 A1 | 7/2002 | Lim | |
| 2004/0009621 A1* | 1/2004 | Shih | H01L 27/14658 438/48 |
| 2004/0207087 A1 | 10/2004 | Kurasina | |
| 2006/0125986 A1* | 6/2006 | Choo | G02F 1/133555 349/114 |
| 2006/0132682 A1* | 6/2006 | Yang | G02F 1/133555 349/114 |
| 2006/0226426 A1* | 10/2006 | Park | G02F 1/13394 257/59 |
| 2007/0171336 A1* | 7/2007 | Kim | G02F 1/13363 349/102 |
| 2008/0049176 A1* | 2/2008 | Kim | G02F 1/133555 349/114 |
| 2009/0147165 A1 | 6/2009 | Kim et al. | |
| 2011/0075081 A1* | 3/2011 | Ishida | G02F 1/1333 349/123 |
| 2011/0133195 A1* | 6/2011 | Park | H01L 27/12 257/59 |
| 2011/0221990 A1* | 9/2011 | Lee | G02F 1/133707 349/41 |
| 2014/0091280 A1 | 4/2014 | Sun | |
| 2015/0212365 A1* | 7/2015 | Beon | G02F 1/133377 349/43 |

OTHER PUBLICATIONS

First Chinese Office Action dated Jul. 1, 2014; Appln. No. 201310053700.2.
International Preliminary Report on Patentability Appln. No. PCT/CN2013/073143; dated Aug. 25, 2015.
Third Chinese Office Action Appln. No. 201310053700.2; dated Jun. 18, 2015.
Second Chinese Office Action dated Jan. 14, 2015; Appln. No. 201310053700.2.
Chinese Notice of Allowance dated Dec. 2, 2015; Appln. No. 201310053700.2.

* cited by examiner

METHOD FOR FABRICATING ARRAY SUBSTRATE, ARRAY SUBSTRATE AND DISPLAY DEVICE

FIELD OF THE ART

Embodiments of the invention relate to the field of display technologies, more particularly, to a method for fabricating an array substrate, an array substrate and a display device.

BACKGROUND

During the fabrication of an array substrate, a planarized layer is normally formed before forming a pixel electrode, such that the step difference in the substrate is reduced, the pixel electrode can be formed more easily and the defect is reduced. Meanwhile, the planarized layer is generally formed as a relatively thick layer such that parasitic capacitance created between the pixel electrode and other conductive metal layers is reduced. However, the planarized layer has to be exposed when fabricating via holes in the planarized layer, such as the via hole connecting the pixel electrode and the TFT drain, or the via hole connecting the drive circuit and the gate line or the data line. As the planarized layer is relatively thick, a high exposure energy is required to obtain the desired via hole size, thereby reducing the exposing speed and decreasing the production efficiency.

SUMMARY

To solve the above technical problems, embodiments of the invention provide a method for fabricating an array substrate, an array substrate and a display device capable of reducing the thickness of the local planarized layer, thereby decreasing the required exposure energy for forming the via hole and in turn increasing the exposing speed and improving the production efficiency.

A first aspect of the invention provides a method for fabricating an array substrate, the array substrate comprises a planarized layer provided with a via hole, the method comprises:

forming a spacer layer on the array substrate, the spacer layer is disposed under the planarized layer of the array substrate and corresponds to a location of the via hole in the planarized layer, wherein the planarized layer is formed of a hot melt material.

Furthermore, the hot melt material is an acrylic material.

Furthermore, the step of forming a spacer layer on the array substrate, the spacer layer is disposed under the planarized layer of the array substrate and corresponds to a location of the via hole in the planarized layer comprises:

providing a base substrate and forming a TFT on the base substrate;

forming the spacer layer above the base substrate; and forming the planarized layer above the spacer layer and forming the via hole in the planarized layer, wherein the spacer layer corresponds to the location of the via hole in the planarized layer.

Furthermore, the step of forming the TFT on the base substrate is embodied as: forming a gate layer, a gate insulation layer, an active layer and a source/drain layer on the base substrate;

the step of forming the spacer layer above the base substrate is embodied as: forming the spacer layer on the base substrate or on any one of the gate layer, the gate insulation layer, the active layer and the source/drain layer.

Furthermore, the method further comprises:

forming a pixel electrode layer on the planarized layer, a pixel electrode is connected to a drain of the TFT by way of the via hole in the planarized layer.

Furthermore, the step of forming the gate layer, the gate insulation layer, the active layer and the source/drain layer further comprises: forming a gate line in the same layer as the gate and forming a data line in the same layer as the source/drain, the gate line and the data line are respectively connected to a drive circuit at a peripheral region of the array substrate by way of the via hole in the planarized layer.

Furthermore, the step of forming the planarized layer on the base substrate having the spacer layer formed thereon comprises:

coating an acrylic material layer on the base substrate having the spacer layer formed thereon;

low-pressure drying and baking the acrylic material layer;

exposing the low-pressure dried and baked acrylic material layer; and developing and baking the exposed acrylic material layer.

A second aspect of the invention provides an array substrate comprising a planarized layer provided with a via hole and further comprising a spacer layer, the spacer layer is disposed under the planarized layer and corresponds to a location of the via hole in the planarized layer, wherein the planarized layer is formed of a hot melt material.

Furthermore, the hot melt material is an acrylic material.

Furthermore, the array substrate specifically is embodied as:

a base substrate and a TFT formed on the base substrate;

the spacer layer formed above the base substrate;

the planarized layer formed above the spacer layer, the planarized layer is provided with the via hole, the spacer layer corresponds to the location of the via hole in the planarized layer.

Furthermore, the TFT comprises a gate, a gate insulation layer, an active layer and a source/drain, the spacer layer is disposed on the base substrate or on any one of a gate layer, the gate insulation layer, the active layer and a source/drain layer.

Furthermore, the array substrate further comprises: a pixel electrode layer, the pixel electrode layer is disposed above the planarized layer, and a pixel electrode is connected to the drain of the TFT by way of the via hole in the planarized layer.

Furthermore, the array substrate further comprises a passivation layer, the passivation layer is disposed under the planarized layer and has a via hole communicating with the via hole in the planarized layer, the pixel electrode and the TFT drain are connected with each other by way of the via hole in the planarized layer and the via hole in the passivation layer.

Furthermore, the array substrate further comprises a data line in the same layer as the source/drain and a gate line in the same layer as the gate, the data line and the gate line are respectively connected to a drive circuit at a peripheral region of the array substrate by way of the via hole in the planarized layer.

A third aspect of the invention provides a display device comprising the above array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 schematically illustrates a cross section of an array substrate without a spacer layer.

DETAILED DESCRIPTION

Figure 1:
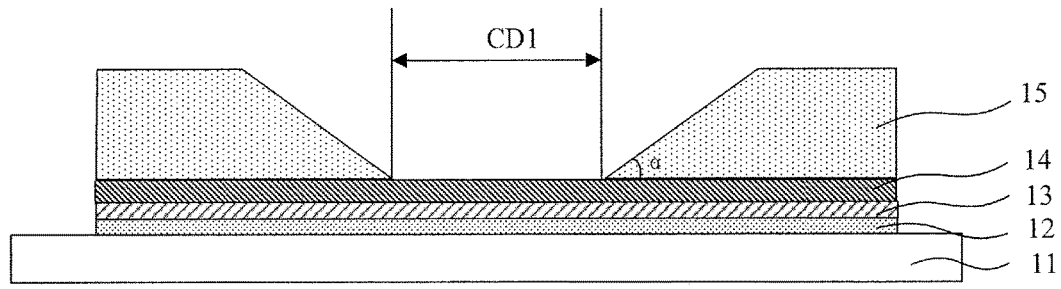

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the invention provides a method for fabricating an array substrate, wherein the array substrate comprises a planarized layer provided with a via hole, and the method comprises: forming a spacer layer on the array substrate, the spacer layer is disposed under the planarized layer of the array substrate and corresponds to a location of the via hole in the planarized layer, wherein the planarized layer is formed of a hot melt material. The hot melt material is a material that becomes fluid when heated to a specific temperature.

Specifically, the method for fabricating the array substrate comprises:

providing a base substrate and forming a thin film transistor (TFT) on the base substrate; forming the planarized layer on the TFT and forming the via hole in the planarized layer; forming the spacer layer on the base substrate, wherein the spacer layer is disposed above the array substrate and under the planarized layer and corresponds to a location of the via hole in the planarized layer.

Specifically, the hot melt material may be an acrylic material. The Acrylic material is a polymer derived from polymerizing acrylic acid and its esters and collectively referred to as acrylic resin, and the corresponding plastic is collectively referred to as polyacrylic plastic, which has the advantages of being lightweight, cheap and easily molded. Methods for molding the material include casting, ejection molding, machining process, thermal molding and the like, among which the ejection molding can be used for mass production and has a simple manufacture process as well as low cost. It can be contemplated that the planarized layer in the embodiment of the invention is not limited to the acrylic material. Instead, any material that presents fluidity when being heated and remains solid at room temperature can be used as the material of the planarized layer in the method for fabricating the array substrate according to the embodiment of the invention.

The via hole in the planarized layer may be a via hole connecting a pixel electrode in the display region and the TFT drain but not limited to that. For example, a drive circuit providing both a gate scan signal and a data signal for the array substrate has to be disposed at the peripheral region of the array substrate, and the drive circuit is respectively connected to a gate line and a data line disposed on the array substrate by way of via hole. Therefore, the via hole in the planarized layer may be a via hole connecting the data line and the drive circuit or a via hole connecting the gate line and the drive circuit. Moreover, the method for fabricating the array substrate according to the embodiment of the invention may be used in variations of other method for fabricating an array substrate in which forming via holes in a planarized layer is required.

With reference to FIGS. 2 to 5, an example in which the via hole is a via hole connecting the pixel electrode and the TFT drain will be described.

The method for fabricating the array substrate provided by the embodiment of the invention comprises:

S1, providing a base substrate 11 and forming a TFT on the base substrate;

S2, forming a spacer layer above the base substrate; and

S3, forming a planarized layer 15 above the spacer layer and forming a via hole (the region indicated by CD2) in the planarized layer 15, wherein the spacer layer is positioned under the location of the via hole.

In the above step S1, the step of forming the TFT on the base substrate specifically comprises:

forming a gate layer (not shown in the figures), a gate insulation layer 12, an active layer 13 and a source/drain layer 14 on the base substrate 11.

In the above step S2, the step of forming the spacer layer above the base substrate specifically comprises: forming the spacer layer on the base substrate or on any one of the gate layer, the gate insulation layer 12, the active layer 13 and the source/drain layer.

It is noted that the gate layer is a layer where the TFT gate locates, the source/drain layer is a layer where the TFT source and the TFT drain locate. The gate layer is generally not present under a location of the via hole connecting the pixel electrode and the TFT drain and thus not shown in the figures. In a method for fabricating other array substrates in which the gate layer under a location of the via hole connecting the pixel electrode and the TFT drain, the spacer layer may also be formed on the gate layer. Generally speaking, the spacer layer may have a material the same as or different from adjacent layers, as long as the normal operation of the TFT and the array substrate is not affected. However, when the via hole is a via hole connecting the pixel electrode and the TFT drain and the spacer layer is formed on the source/drain layer, the material is preferably conductive such that the pixel electrode and the TFT drain can be electrically connected with each other.

Figure 2:
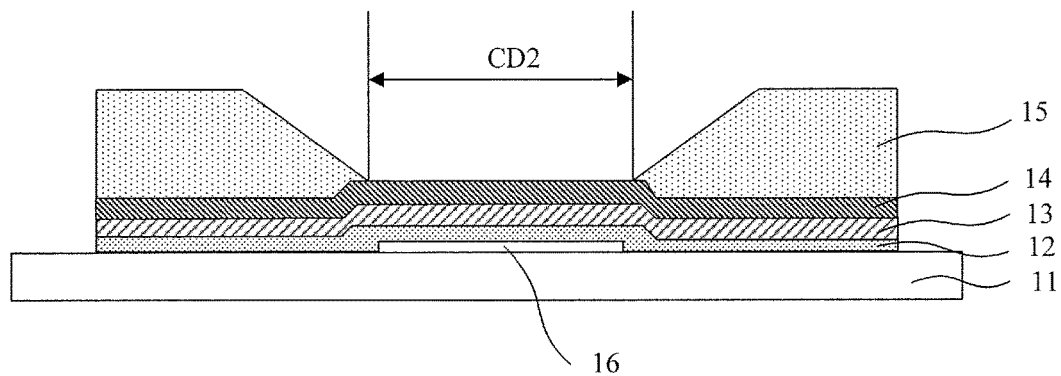
FIG. 2 schematically illustrates a cross section of an array substrate in accordance with an embodiment of the invention.

As illustrated in FIG. 2, the spacer layer 16 may be directly formed on the base substrate 11. The spacer layer may be formed on the base substrate through a separate patterning process (that is, a first patterning process is used to form the spacer layer on the base substrate 11 and a second patterning process is used to form the gate layer) or through the same patterning process as the gate layer.

Figure 3:
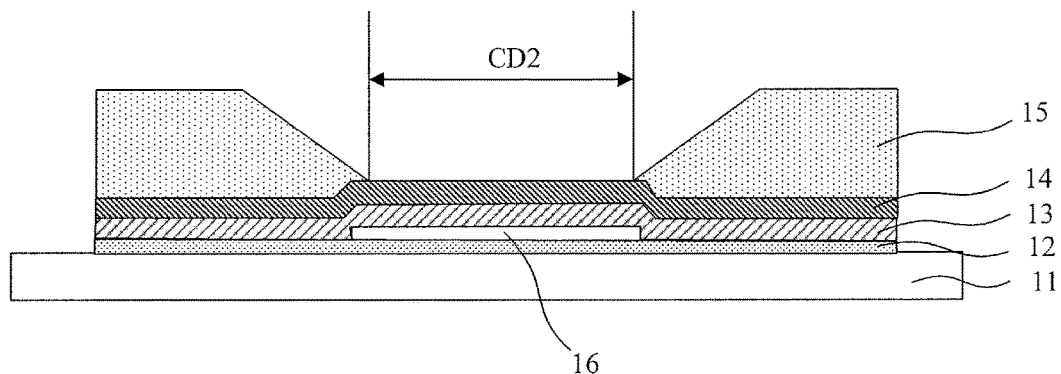
FIG. 3 schematically illustrates a cross section of an array substrate in accordance with another embodiment of the invention.

As illustrated in FIG. 3, the spacer layer 16 may be formed on the gate insulation layer 12. The spacer layer may be formed on the gate insulation layer through a separate patterning process, or through the same patterning process as the gate layer by using the semi-exposing technology.

Figure 4:
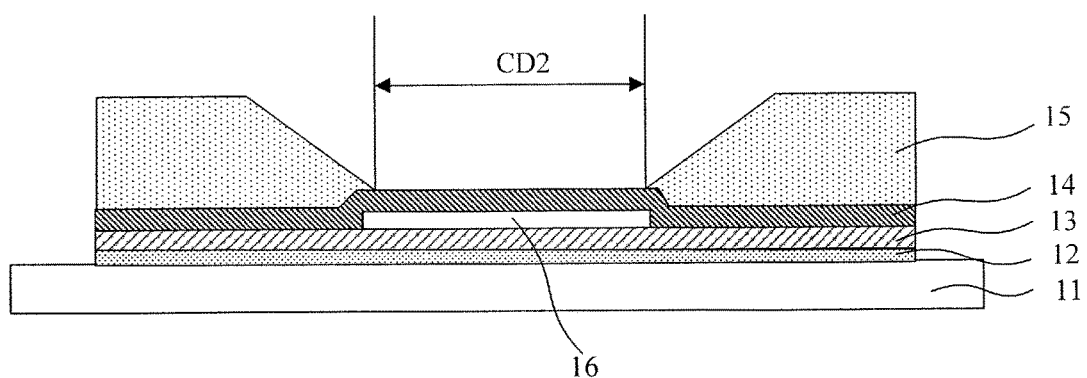
FIG. 4 schematically illustrates a cross section of an array substrate in accordance with another embodiment of the invention.

As illustrated in FIG. 4, the spacer layer 16 may be formed on the active layer 13. The spacer layer may be formed on the active layer 13 through a separate patterning process, or through the same patterning process as the active layer by using the semi-exposing technology.

Figure 5:
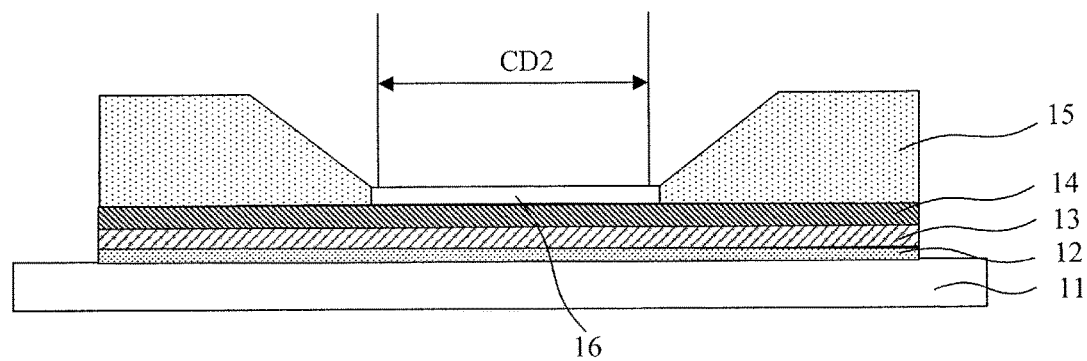
FIG. 5 schematically illustrates a cross section of an array substrate in accordance with another embodiment of the invention.

As illustrated in FIG. 5, the spacer layer 16 may also be formed on the source/drain layer 14. The spacer layer may be formed on the source/drain layer through a separate patterning process, or through the same patterning process as the source/drain layer by using the semi-exposing technology. It can be contemplated that the spacer layer has to be a conductive material in order to guarantee the electrical connection between the pixel electrode and the TFT drain electrode.

In the above step S3, the step of forming the planarized layer 15 above the spacer layer and forming the via hole in the planarized layer 15 specifically comprises:

coating an acrylic material layer on the base substrate having the spacer layer formed thereon; low-pressure drying and baking the acrylic material layer; exposing the low-pressure dried and baked acrylic material layer; and developing and baking the exposed acrylic material layer. It is noted that low-pressure drying and baking the acrylic material layer is to mold the acrylic material layer by baking under a low pressure environment and by further curing under a heating condition; developing the exposed acrylic material layer is to form the via hole by using a developer, and baking is to remove both the remaining developer and the cleansing agent for cleaning the developer.

As an example, the method for fabricating the array substrate further comprises:

forming a pixel electrode layer above the planarized layer, the pixel electrode layer is connected to the TFT drain by way of the via hole in the planarized layer, wherein the pixel electrode layer is a layer where the pixel electrode locates.

As described above, if the via hole is a via hole connecting the drive circuit in the peripheral region of the array substrate and the data line or a via hole connecting the drive circuit and the gate line, then in the above step S1, the step of forming the gate layer, the gate insulation layer, the active layer and the source/drain layer further comprises:

in the array substrate, forming a gate line in the same layer as the gate and forming a data line in the same layer as the source/drain;

connecting the gate line and the data line respectively to the drive circuit by way of the via hole in the planarized layer.

It is noted that a plurality of via holes may be formed in the planarized layer, therefore, the spacer layer may be formed at a plurality of locations, and spacer layers under via holes at different locations may be formed in the same or different layer. However, the spacer layers are preferably formed in the same layer so as to simplify the process. For example, the spacer layers may be formed simultaneously on the base substrate at locations which correspond to the via hole connecting the pixel electrode and the TFT drain, the via hole connecting the gate line and the drive circuit, and the via hole connecting the data line and the drive circuit.

In the above method for fabricating the array substrate, it is noted that the gate layer, the gate insulation layer, the active layer and the source/drain layer are not necessarily all present under the via hole in the planarized layer. For example, it is possible that the gate layer is not present under the via hole connecting the pixel electrode layer and the TFT drain; it is possible that the gate insulation layer and the active layer are not present under the via hole connecting the gate line and the drive circuit. It can be contemplated that the order of the gate layer, the gate insulation layer, the active layer and the source/drain layer is not limited to that shown in the figure, in which only a bottom-gate TFT array substrate is shown. The method for fabricating the array substrate according to the embodiment of the invention is also applicable to a top-gate TFT array substrate and other configured variations.

It can be contemplated that the above method for fabricating the array substrate may further comprise a step of forming a passivation layer above the source/drain in layer, the planarized layer is formed above the passivation layer, and the via hole should further penetrate through the passivation layer. Specifically, a single mask process may be used to fabricate the via hole penetrating through both the passivation layer and the planarized layer. Alternatively, two mask processes may be used to fabricate the via hole penetrating through the planarized layer and the via hole penetrating through the passivation layer, respectively.

In other embodiments, the fabrication method may further comprise: forming a buffer layer (which may comprise: a silicon nitride buffer layer and a silicon dioxide buffer layer) on the base substrate; forming the gate insulation layer, the active layer and the source/drain layer after forming the buffer layer. The spacer layer may also be formed on the buffer layer.

In other embodiments, such as a method for fabricating a top-gate low temperature poly-silicon (LTPS) TFT array substrate, the method may further comprise: forming an interlayer insulation layer between the layer having the gate and the source/drain layer. The spacer layer may also be formed on the interlayer insulation layer.

In summary, the spacer layer 16 may be formed on the base substrate or on any layer sandwiched between the base substrate and the planarized layer, for example, on the gate layer, or on the gate insulation layer, or on the active layer, or on the source/drain layer. It can be contemplated that if there are other layers sandwiched between the base substrate and the planarized layer, the spacer layer may also be formed on the other layers at the location corresponding to the via hole in the planarized layer, as long as the thickness of the hot melt material (such as the acrylic material) at the location where the via hole to be formed can be reduced by increasing the height under the via hole of the planarized layer when forming the planarized layer. However, the spacer layer 16 is preferably disposed on the base substrate or on a layer close to the base substrate, so as to facilitate the formation of the via hole. By taking the via hole being one connecting the pixel electrode and the TFT drain as an example, the spacer layer is preferably disposed on the base substrate or on a layer below the source/drain layer. By taking the via hole being one connecting the data line and the drive circuit as an example, the spacer layer is preferably disposed on the base substrate or on a layer below the source/drain layer. By taking the via hole being one connecting the gate line and the drive circuit as an example, the spacer layer is preferably disposed on the base substrate or on a layer below the gate layer.

In the method for fabricating individual array substrates described above, a thickness of the planarized layer is typically greater than 2 μm. With the introduction of the spacer layer 16, the total thickness from the upper surface of the whole array substrate to the upper surface of the planarized layer remains the same. However, due to the existence of the spacer layer and the acrylic material forming the planarized layer is prone to flow, the thickness of the planarized layer at the location corresponding to the via hole is reduced during the exposing process. With the reduction in the thickness of the planarized layer, the critical dimension (CD, that is the diameter of the via hole) of the resultant via hole is increased under the same exposure energy. As illustrated in FIGS. 1 and 2, FIG. 1 is a cross section view of an array substrate with no spacer layer, and FIG. 2 is a cross section view of an array substrate having the spacer layer in accordance with Embodiment 1 of the invention. When the height of the spacer layer is denoted as H, the variation amount of CD (the diameter of the via hole) is: $CD2-CD1=2\times H/tg\alpha$, where $\alpha$ is an angle between a bottom surface of the planarized layer and a side wall of the via hole when no spacer layer is present. Due to the existence of the spacer layer, lower exposure energy is required to obtain a standard-sized via hole, thereby increasing the exposing speed and further increasing the production capacity of the equipment.

An embodiment of the invention further provides an array substrate comprising a planarized layer provided with a via hole; the array substrate further comprises a spacer layer, the spacer layer is disposed under the planarized layer of the array substrate and corresponds to a location of a via hole in the planarized layer, wherein the planarized layer is formed of a hot melt material.

Specifically, the hot melt material may be an acrylic material. Acrylic material is a polymer derived from polymerizing acrylic acid and its esters and collectively referred to as acrylic resin, and the corresponding plastic are collectively referred to as polyacrylic plastic, which has the advantages of being lightweight, cheap and easily molded. Methods for molding the material include casting, ejection molding, machining process, thermal molding and the like, among which the ejection molding can be used for mass production and has a simple manufacture process as well as low cost. It can be contemplated that the planarized layer in the embodiment of the invention is not limited to the acrylic material. Instead, any material that becomes flowable when being heated and remains solid at room temperature can be used as the material of the planarized layer in the method for fabricating the array substrate according to the embodiment of the invention.

The via hole in the planarized layer may be a via hole connecting a pixel electrode and the TFT drain. At the peripheral region of the array substrate, a drive circuit is respectively connected to a gate line and a data line by way of the via hole, to provide a row scan signal and a data signal for the array substrate. Therefore, the via hole in the planarized layer may be a via hole connecting the data line and the drive circuit or a via hole connecting the gate line and the drive circuit. It can be contemplated that the via hole in the array substrate of the invention is not limited to aforementioned types via holes. In variations of otherwise configured array substrates, the configuration of the array substrate according to the embodiment of the invention is applicable as long as via holes are formed in the planarized layer.

Specifically, an example in which the via hole is a via hole connecting the pixel electrode and the TFT drain will be described.

The embodiment of the invention provides an array substrate comprising:
a base substrate and a TFT formed on the base substrate;
a spacer layer formed above the base substrate;
a planarized layer formed above the spacer layer, the via hole is provided in the planarized layer, the spacer layer corresponds to the location of the via hole in the planarized layer.

Specifically, the TFT comprises a gate, a gate insulation layer, an active layer and a source/drain; the spacer layer is disposed on the base substrate or on any one of the gate layer, the gate insulation layer, the active layer and the source/drain layer. The gate layer is the layer where the gate locates; the source/drain layer is the layer where the TFT source and drain locate.

It can be contemplated that the gate layer is generally not present under the via hole when the via hole is one connecting the pixel electrode and the TFT drain and thus not shown in the figure. In case there is the gate layer under the via hole, the spacer layer may also be disposed on the gate layer. Generally speaking, the spacer layer may have a material that is same as or different from the material of the adjacent layers, as long as the normal operation of the TFT and the array substrate is not affected. However, when the via hole is one connecting the pixel electrode and the TFT drain and the spacer layer is formed on the source/drain layer, the material is preferably conductive such that the pixel electrode and the TFT drain can be electrically connected with each other.

As illustrated in FIG. 2, the spacer layer 16 may be formed on the base substrate 11. Specifically, the spacer layer may be a single layer which is separately formed on the base substrate or formed in the same layer as the gate.

As illustrated in FIG. 3, the spacer layer 16 may be formed on the gate insulation layer 12. Specifically, the spacer layer may be a single layer which is separately formed on the gate insulation layer 12 or formed in the same layer as the gate insulation layer by using the semi-exposing technology.

As illustrated in FIG. 4, the spacer layer 16 may be formed on the active layer 13. Specifically, the spacer layer may be a single layer which is separately formed on the active layer 13 or formed in the same layer as the active layer by using the semi-exposing technology.

As illustrated in FIG. 5, the spacer layer 16 may also be formed on the source/drain layer 14. Specifically, the spacer layer may be a single layer which is separately formed on the source/drain layer 14 or formed in the same layer as the source/drain layer by using the semi-exposing technology. It can be contemplated that the spacer layer is made of a conductive material to guarantee the electrical connection between the pixel electrode and the TFT drain.

As an example, the array substrate further comprises a pixel electrode layer disposed above the planarized layer, the via hole in the planarized layer is configured for connecting the pixel electrode and the TFT drain, wherein the pixel electrode layer is a layer where the pixel electrode locates.

If the via hole in the planarized layer further comprises a via hole connecting the drive circuit and the data line, and a via hole connecting the drive circuit and the gate line, then the array substrate further comprises: a gate line formed in the same layer as the gate, and a data line formed in the same layer as the source/drain. In the array substrate, the data line and the gate line are respectively connected to a drive circuit by way of the via holes in the planarized layer.

It is noted that a plurality of via holes may be formed in the planarized layer, therefore, the spacer layer may also be formed at a plurality of locations, and spacer layers under via holes at different locations may be formed in the same or different layer. However, the spacer layers are preferably fainted in the same layer so as to simplify the process. For example, the spacer layers are formed simultaneously on the base substrate at locations which correspond to the via hole connecting the pixel electrode and the drain gate, the via hole connecting the gate line and the drive circuit, and the via hole connecting the data line and the drive circuit.

The gate layer, the gate insulation layer 12, the active layer 13 and the source/drain layer 14 are not necessarily all present under the corresponding via hole in the planarized layer. For example, it is possible that the gate layer is not present under the corresponding via hole connecting the pixel electrode and the TFT drain; it is possible that the gate insulation layer and the active layer are not present under the corresponding via hole connecting the drive circuit and the gate line. It can be contemplated that the order of the gate layer, the gate insulation layer 12, the active layer 13 and the source/drain layer 14 is not limited to that shown in the figure, in which only a bottom-gate TFT array substrate is shown. The method for fabricating the array substrate according to the embodiment of the invention is also applicable to top-gate TFT array substrates.

It can be contemplated that the above array substrate may further comprise a passivation layer formed under the planarized layer. In this case, the via hole should also penetrate through the passivation layer, that is, the via hole passes through both the passivation layer and the planarized layer, and the pixel electrode and the TFT drain are connected with each other by way of the via hole. Alternatively, under the via hole of the planarized layer, the passivation layer also has a via hole formed therein, and the via hole in the passivation layer communicates with the via hole in the planarized layer, the pixel electrode and the TFT drain are connected with each other by way of the via hole in the planarized layer and the via hole in the passivation layer.

In other embodiments, the above array substrate may further comprise: a buffer layer (which may comprise: a silicon nitride buffer layer and a silicon dioxide buffer layer) formed on the base substrate; the gate layer, the gate insulation layer, the active layer and the source/drain layer are formed above the buffer layer. The spacer layer may also be formed on the buffer layer.

In other embodiments, such as a top-gate LTPS TFT array substrate, the array substrate may further comprise: an interlayer insulation layer formed between the gate layer and the source/drain layer. The spacer layer may also be formed on the interlayer insulation layer.

In summary, the spacer layer 16 may be disposed on the base substrate or on any layer sandwiched between the base substrate and the planarized layer, for example, on the gate layer, or on the gate insulation layer, or on the active layer, or on source/drain layer. It can be contemplated that if there are other layers sandwiched between the base substrate and the planarized layer, the spacer layer may also be formed on the other layers at the location corresponding to the via hole in the planarized layer, as long as the thickness of the hot melt material (such as the acrylic material) at the location where the via hole to be formed can be reduced by increasing the height under the via hole of the planarized layer when forming the planarized layer. However, the spacer layer 16 is preferably disposed on the base substrate or a layer close to the base substrate, so as to facilitate the formation of the via hole. By taking the via hole being one connecting the pixel electrode and the TFT drain as an example, the spacer layer is preferably disposed on the base substrate or on a layer below the source/drain layer. By taking the via hole being one connecting the data line and the drive circuit as an example, the spacer layer is preferably disposed on the base substrate or on a layer below the source/drain layer. By taking the via hole being one connecting the gate line and the drive circuit as an example, the spacer layer is preferably disposed on the base substrate or on a layer below the gate layer.

Moreover, another embodiment of the invention further provides a display device comprising the array substrate of any one of the above embodiments.

An example of the display device is a LCD device, in which the array substrate and an opposed substrate are disposed as opposed to each other to form a liquid crystal cell and liquid crystal material is filled in the liquid crystal cell. The opposed substrate is for example a color filter substrate. The pixel electrode of each pixel element on the array substrate is configured for applying an electrical field to control the degree of rotation of the liquid crystal material, so as to display images. In other examples, the LCD device may further comprise a backlight module for providing backlight to the array substrate.

Another example of the display device is an organic electroluminescent display device (OLED), wherein stacked layers of organic light emitting material are formed on the array substrate, the pixel electrode of each pixel element functions as an anode or a cathode for driving the organic light emitting material to emit light, so as to display images.

Still another example of the display device is an E-paper display device, in which an E-ink layer is formed on the array substrate, the pixel electrode of each pixel element functions to apply a voltage for driving charged microparticles in the E-ink to move, so as to display images.

In the display devices of the embodiments of the invention, due to the existence of the spacer layer below the via hole in the planarized layer of the array substrate and that the material of the planarized layer becomes flowable when being heated, the thickness of the planarized layer at the location corresponding to the via hole is reduced during the exposing process. With the reduction in the thickness of the planarized layer, lower exposure energy is required to obtain standard-sized via holes, thereby increasing the exposing speed and further improving the production capacity of the device.

What are described above is related to the illustrative embodiments of the disclosure only and not limitative to the scope of the disclosure; the scopes of the disclosure are defined by the accompanying claims.

What is claimed is:

1. An array substrate, comprising a base substrate and a TFT formed on the base substrate; a spacer layer formed above the base substrate; a planarized layer formed above the spacer layer, the planarized layer is provided with first via holes and a second via hole, the spacer layer corresponds to locations of each of first via holes and a location of the second via hole in the planarized layer, wherein the planarized layer is formed of a hot melt material;

the TFT comprises a gate, a gate insulation layer, an active layer and a source/drain, the spacer layer is disposed on and in contact with any one of a gate layer, the gate insulation layer, the active layer and a source/drain layer;

the array substrate further comprising a data line in the same layer as the source/drain and a gate line in the same layer as the gate, both the data line and the gate line are connected to a drive circuit at a peripheral region of the array substrate by way of the respective first via holes in the planarized layer.

2. The array substrate of claim 1, wherein the hot melt material is an acrylic material.

3. The array substrate of claim 1, further comprising: a pixel electrode layer, the pixel electrode layer is disposed above the planarized layer, and a pixel electrode is connected to the drain of the TFT by way of the second via hole in the planarized layer.

4. The array substrate of claim 3, further comprising a passivation layer, the passivation layer is disposed under the planarized layer and has a via hole communicating with the second via hole in the planarized layer, the pixel electrode and the drain of the TFT are connected with each other by way of the second via hole in the planarized layer and the via hole in the passivation layer.

5. A display device comprising the array substrate of claim 1.

* * * * *